(12) United States Patent
Kim et al.

(10) Patent No.: US 7,988,873 B2
(45) Date of Patent: Aug. 2, 2011

(54) METHOD OF FORMING A MASK PATTERN FOR FABRICATING A SEMICONDUCTOR DEVICE

(75) Inventors: Hyong-Soo Kim, Gyeonggi-do (KR); Sang-Hyeop Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1071 days.

(21) Appl. No.: 11/768,748

(22) Filed: Jun. 26, 2007

(65) Prior Publication Data
US 2007/0298616 A1   Dec. 27, 2007

(30) Foreign Application Priority Data

Jun. 26, 2006 (KR) .................. 10-2006-0057700

(51) Int. Cl.
*B44C 1/22* (2006.01)
(52) U.S. Cl. .......... 216/67; 216/74; 216/79; 438/717; 438/723; 438/724; 438/740; 438/743
(58) Field of Classification Search .......... 216/67, 216/74, 79; 438/717, 723, 724, 740, 743
See application file for complete search history.

(56) References Cited

U.S. PATENT DOCUMENTS

| | | |
|---|---|---|
| 2005/0048771 A1 | 3/2005 | Gao et al. |
| 2005/0191832 A1* | 9/2005 | Huang et al. .......... 438/585 |
| 2005/0194616 A1* | 9/2005 | Yoon et al. .......... 257/213 |
| 2006/0246740 A1* | 11/2006 | Cartier et al. .......... 438/778 |
| 2007/0057325 A1* | 3/2007 | Hsu et al. .......... 257/347 |
| 2007/0093055 A1* | 4/2007 | Chou et al. .......... 438/638 |

FOREIGN PATENT DOCUMENTS

| | | |
|---|---|---|
| JP | 2000-223490 | 8/2000 |
| JP | 2006-32714 | 2/2006 |
| KR | 10-2001-0045127 | 6/2001 |
| KR | 10-2005-0119910 | 12/2005 |
| KR | 10-2006-0011392 | 2/2006 |

OTHER PUBLICATIONS

English language abstract of Korean Publication No. 10-2001-0045127.
English language abstract of Korean Publication No. 10-2006-0011392.

* cited by examiner

*Primary Examiner* — Binh X Tran
(74) *Attorney, Agent, or Firm* — Myers Bigel Sibley & Sajovec, P.A.

(57) ABSTRACT

A method of forming a mask pattern for fabricating a semiconductor device. A first region and a second region, having an intersecting third region, are defined in the semiconductor substrate. An inorganic mask layer is etched in the first region to a predetermined thickness, and etched in the second region to another predetermined thickness. While the inorganic mask layer is etched in the first and second region, an organic mask layer is exposed in the third region. The organic mask layer exposed in the third region is removed to form a mask pattern. Consequently, double exposure is performed using the organic mask layer and the inorganic mask layer, so that a fine feature size that closely follows a desired layout can be formed, damage to the organic mask layer by ashing is prevented, and adhesiveness between the organic mask layer and the inorganic mask layer can be improved.

16 Claims, 24 Drawing Sheets

METHOD OF FORMING A MASK PATTERN FOR FABRICATING A SEMICONDUCTOR DEVICE

CROSS-REFERENCE TO RELATED APPLICATIONS

This U.S. non-provisional patent application claims priority under 35 U.S.C. §119 of Korean Patent Application No. 2006-57700, filed on Jun. 26, 2006, the entire contents of which are hereby incorporated by reference.

BACKGROUND

The present invention disclosed herein relates to a method of fabricating a semiconductor device, and more particularly, to a method of forming a mask pattern for photolithography.

In a process of fabricating a semiconductor device, photolithography is used to form a pattern on a semiconductor substrate.

As the integration of a semiconductor device increases, its pattern features and line widths become finer, while an etched material layer becomes relatively thicker in comparison to the shrinking feature sizes. Therefore, a variety of technologies have been introduced to overcome difficulties in pattern formation caused by optical limitations and optical proximity effects and to provide a mask layer having etch resistance during a process of etching a thick material layer.

SUMMARY

Embodiments of the present invention provide a method of forming a mask pattern for forming a pattern with a fine line width and feature size that closely reflects that of the intended pattern.

Embodiments of the present invention provide methods of forming a mask pattern using a double exposure.

In some embodiments, an organic mask layer and an inorganic mask layer are stacked on a semiconductor substrate. A first region and a second region having an intersecting third region may be arbitrarily defined in the semiconductor substrate. The inorganic mask layer is etched in the first region to a predetermined thickness, and is etched in the second region to another predetermined thickness. While the inorganic mask layer is etched in the first and second regions, the organic mask layer is exposed in the third region. The organic mask layer exposed in the third region may be removed to form a mask pattern.

In other embodiments, the mask pattern may be used as an etching mask for etching a lower hard mask layer. That is, the hard mask layer is exposed in the third region of the opened mask pattern, and the hard mask layer exposed in the third region is removed using the organic mask layer and the inorganic mask layer as an etching mask, thereby forming a hard mask pattern.

In still other embodiments, the inorganic mask layer may be formed by stacking a first inorganic mask layer and a second inorganic mask layer that have etch selectivity. Here, when the inorganic mask layer is etched in the first region, the second inorganic mask layer is etched to a predetermined thickness. When the inorganic mask layer is etched in the second region, the second inorganic mask layer remaining in the third region is removed to expose the first inorganic mask layer. The exposed first inorganic mask layer is removed to expose the organic mask layer.

In yet other embodiments, when the inorganic mask layer is etched in the first region, the second inorganic mask layer is removed to expose the first inorganic mask layer. When the inorganic mask layer is etched in the second region, the exposed first inorganic mask layer is removed to expose the organic mask layer.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIGS. 1A through 6A are plan views for describing a first embodiment;

FIGS. 1B through 6B are cross-sectional views taken along lines I-I' of FIGS. 1A through 6A, respectively;

FIGS. 1C through 6C are cross-sectional views taken along lines II-II' of FIGS. 1A through 6A;

FIGS. 9A through 13A are plan views for describing a preferred embodiment;

FIGS. 9B through 13B are cross-sectional views taken along lines I-I' of FIGS. 9A through 13A, respectively; and FIGS. 9C through 13C are cross-sectional views taken along lines II-II' of FIGS. 9A through 13A, respectively.

DETAILED DESCRIPTION

Figure 1A:
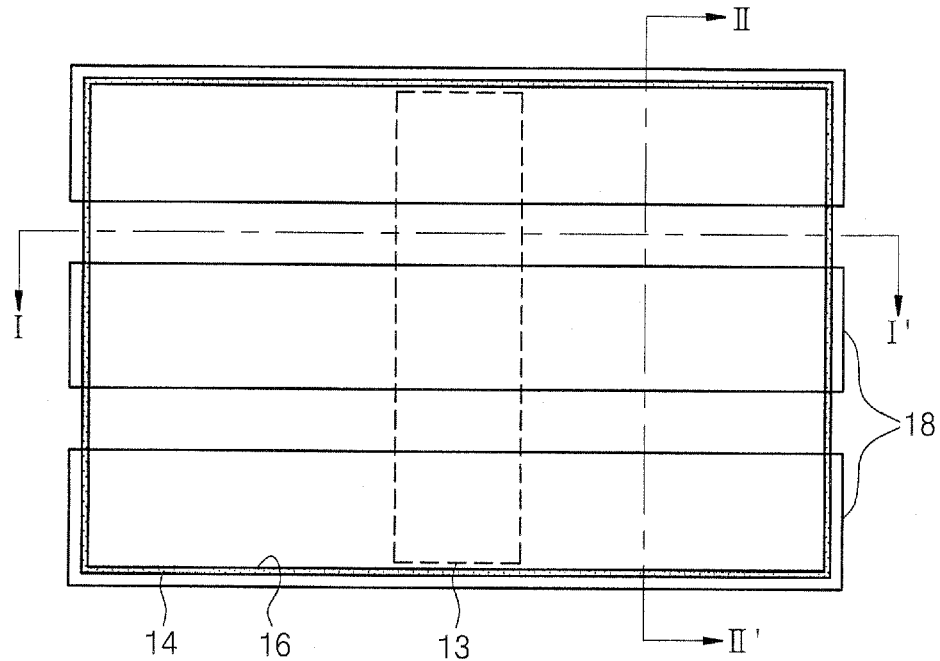

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Also, it will be understood that when a component is referred to as being 'adjacent' to another component, it can directly contact the other component, or intervening components spacing them apart from each other may also be present. Like reference numerals refer to like elements throughout.

Hereinafter, an exemplary embodiment of the present invention will be described in conjunction with the accompanying drawings.

FIGS. 1A through 6A are plan views for describing a preferred embodiment. FIGS. 1B through 6B are cross-sectional views taken along lines I-I' of FIGS. 1A through 6A, respectively. And FIGS. 1C through 6C are cross-sectional views taken along lines II-II' of FIGS. 1A through 6A.

Figure 1B:
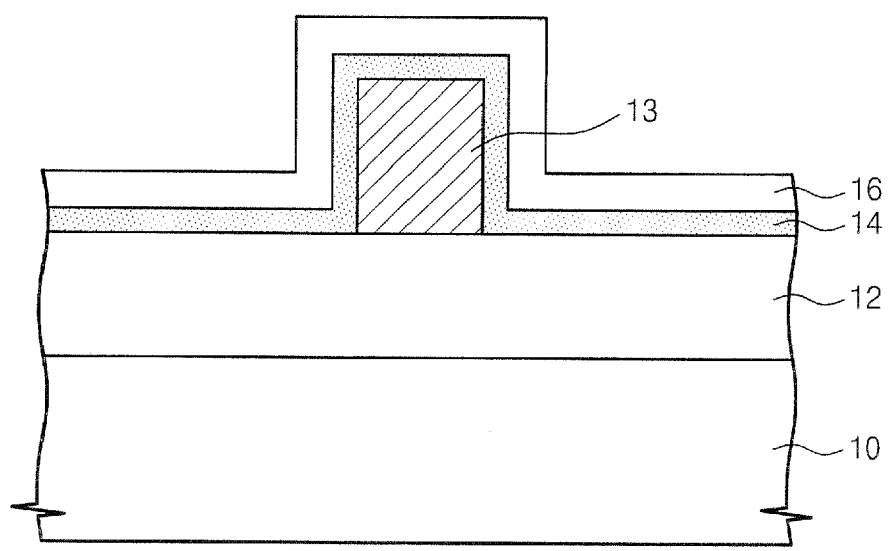
Figure 1C:
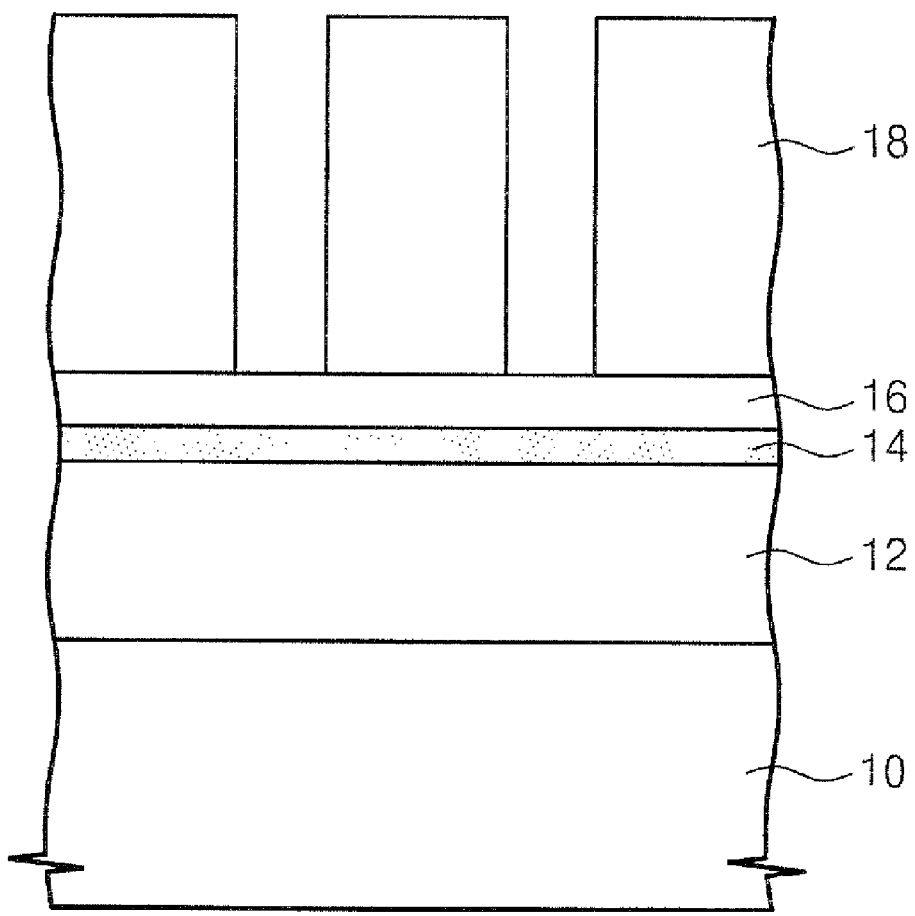

Referring to the embodiment of FIGS. 1A, 1B and 1C, a lower layer 12 is formed on a semiconductor substrate 10, and an organic mask layer 14 and an inorganic mask layer 16 are formed on the lower layer 12.

The lower layer 12 may be a hard mask layer for patterning a material of the semiconductor substrate 10 or a material layer that is etched to form a semiconductor pattern.

As illustrated, a predetermined structure 13 may be formed on the lower layer 12, and the organic mask layer 14 and the inorganic mask layer 16 may be formed conformally thereon. However, the structure 13 may be formed under the lower layer 12, and the organic and inorganic mask layers 14 and 16 may be formed conformally on the lower layer 12, for example.

The organic mask layer 14 may be formed of an insulating material including carbon, such as an amorphous carbon layer (ACL). The inorganic mask layer 16 may be a silicon oxide layer.

The organic mask layer 14 and the inorganic mask layer 16 may be formed conformally on the structure 13 and the substrate 10.

To prevent ashing of the organic mask layer 14 during an ashing process, the inorganic mask layer 16 may be formed using one chosen from undoped silicon glass (USG), atomic layer deposition (ALD), or radical chemical vapor deposition (RACVD) providing excellent step coverage, without using a plasma method.

A first photoresist pattern 18 is then formed on the inorganic mask layer 16. Although not shown in the drawing, a first region and a second region may be defined in the semiconductor substrate 10. The first region and the second region may be configured to have an overlapping region therebetween, and the overlapping region between the first region and the second region may then be defined as a third region.

The first photoresist pattern 18 may include an opening that exposes the inorganic mask layer 16 of the first region. In the example illustrated, the first photoresist pattern 18 includes a first opening with a trench shape extending in one direction.

Figure 2A:
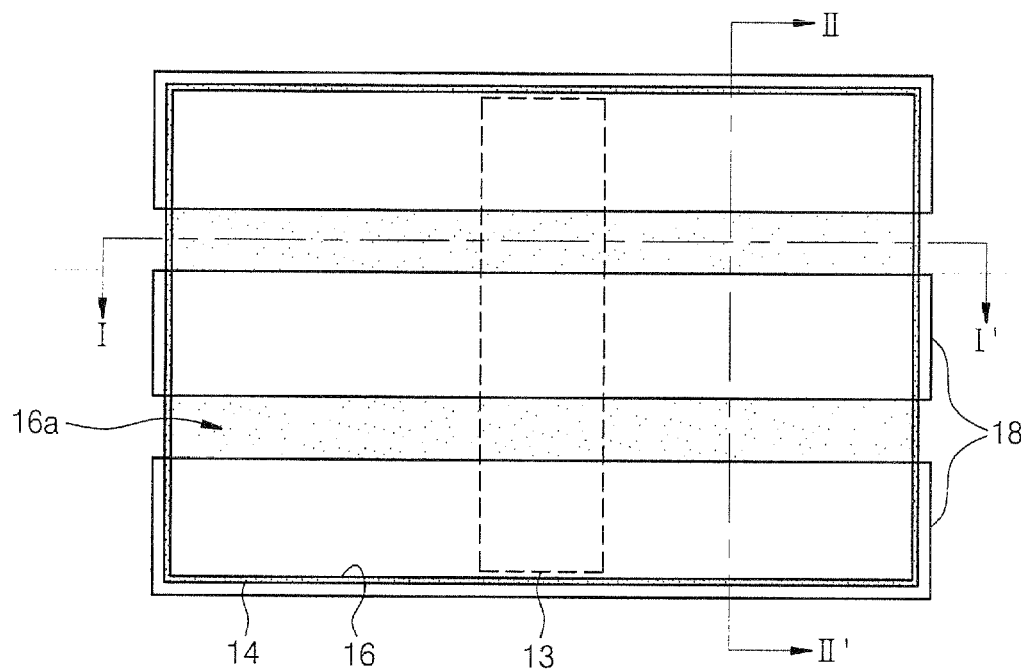
Figure 2B:
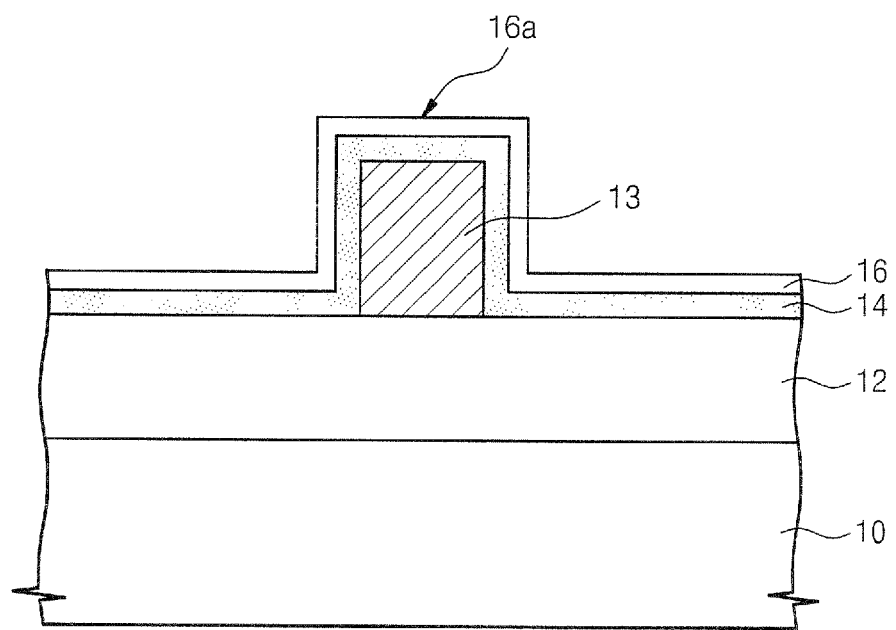
Figure 2C:
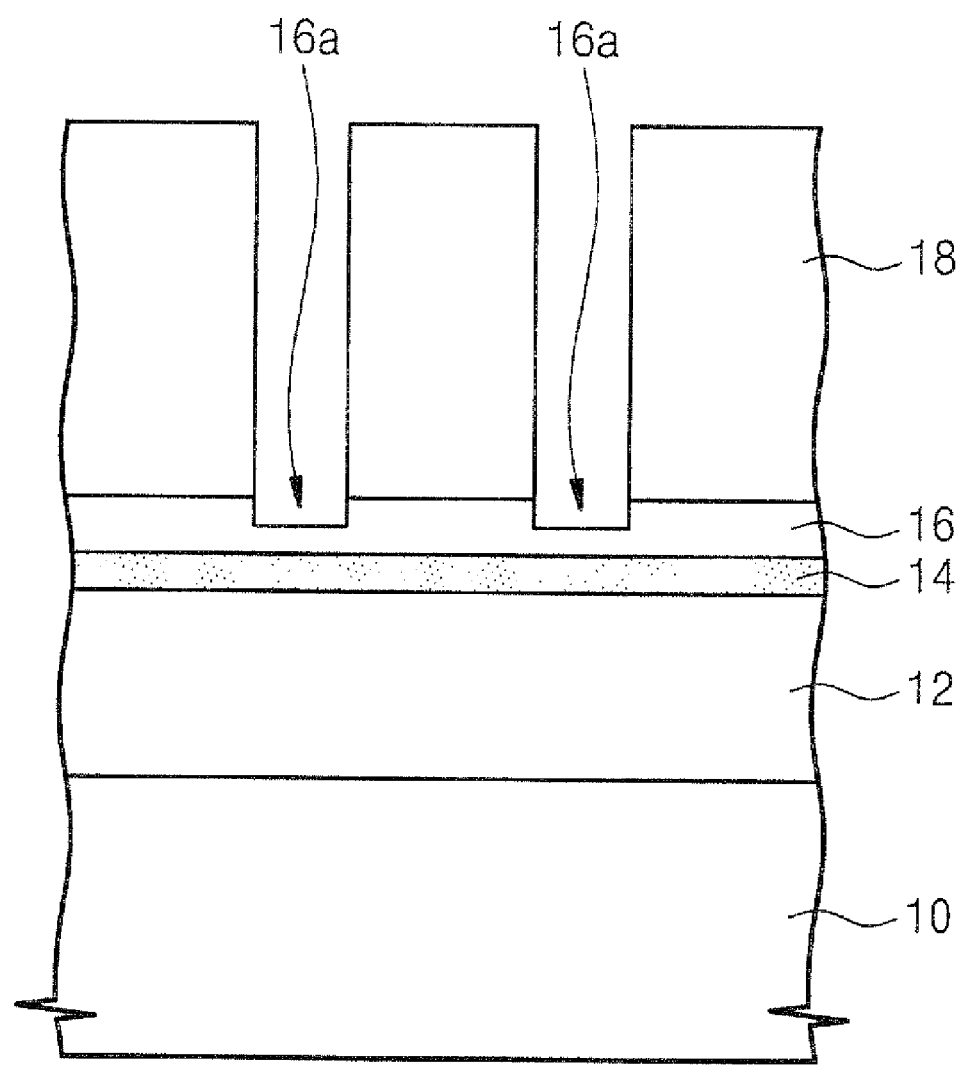

Referring now to FIGS. 2A, 2B and 2C, a portion of the inorganic mask layer 16 of the first region may be etched using the first photoresist pattern 18 as an etching mask to form a first recess region 16a. The inorganic mask layer 16 may not be completely etched in the first region, so that it covers the organic mask layer 14 with a predetermined thickness in the first recess region 16a.

The first recess region 16a may have a trench shape transferred from the first opening of the first photoresist pattern 18.

Figure 3A:
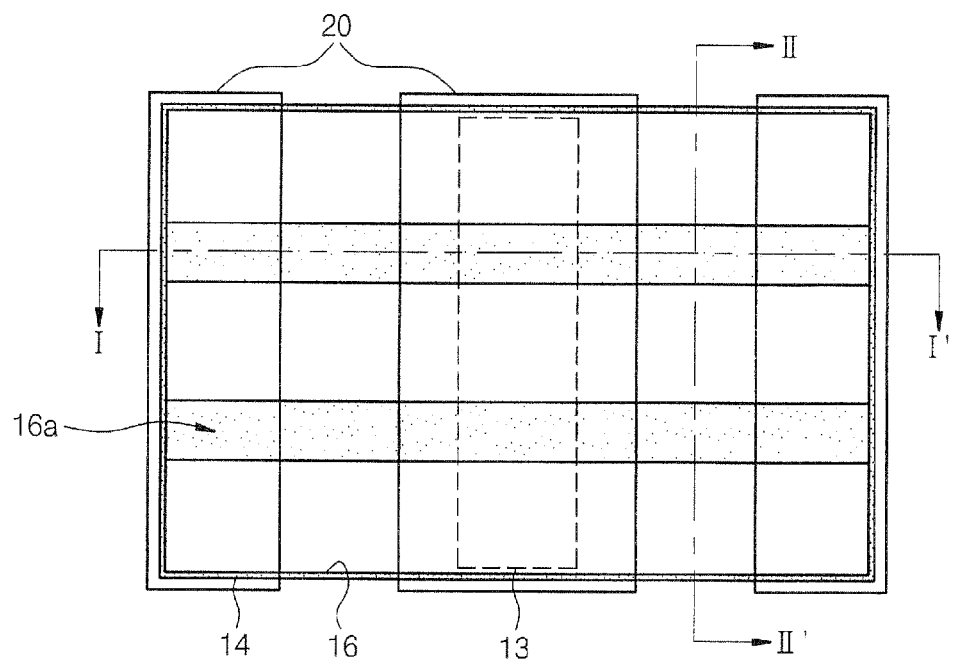
Figure 3B:
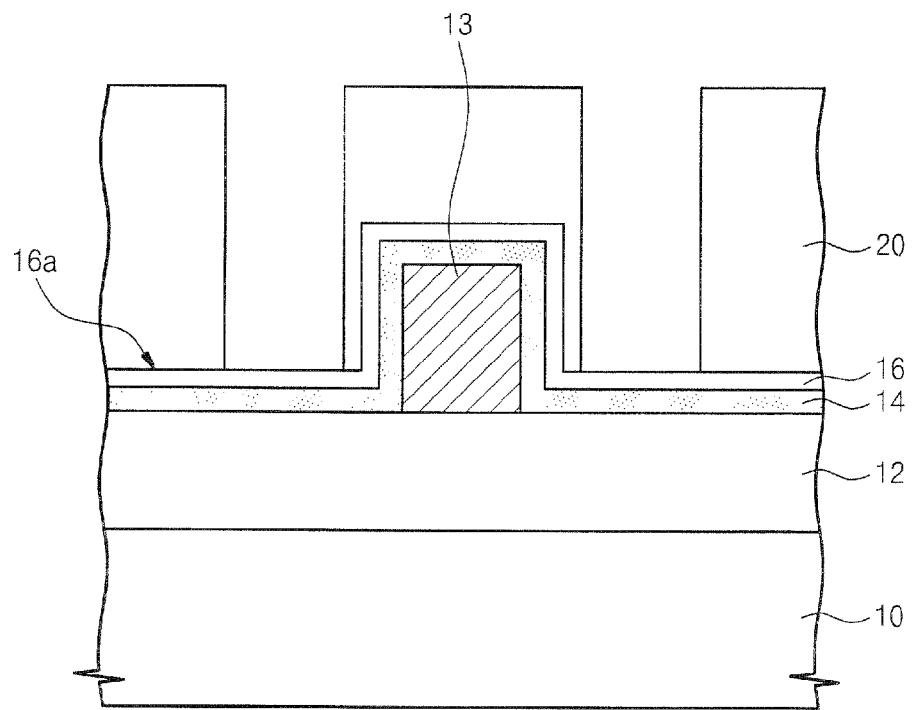
Figure 3C:
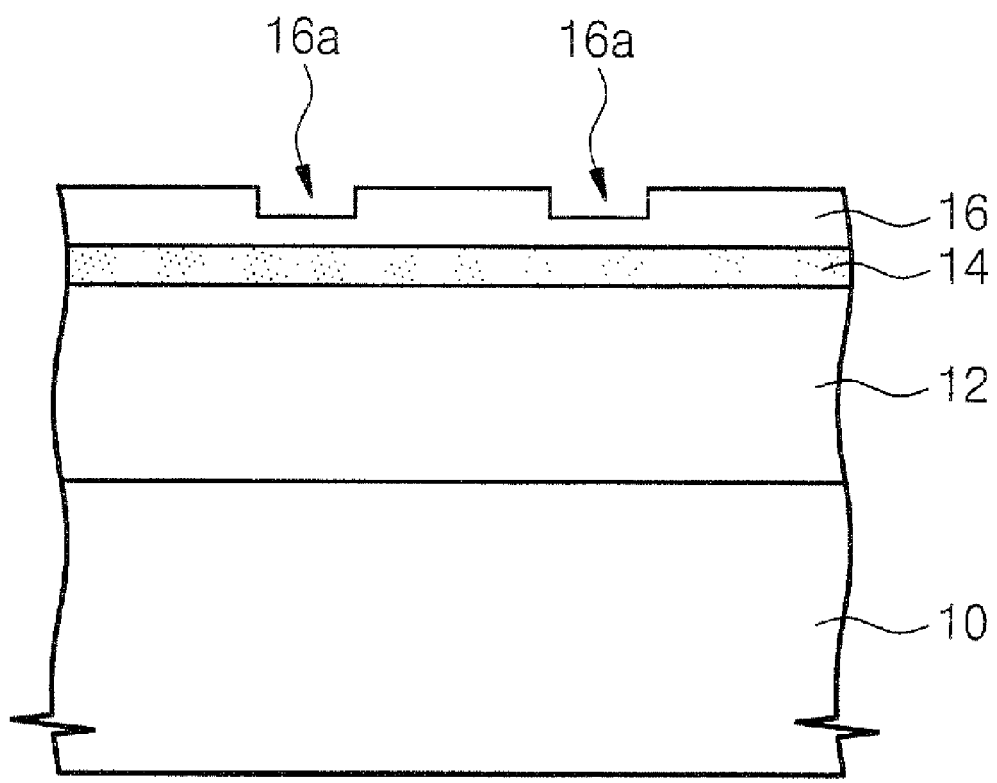

Referring to FIGS. 3A, 3B and 3C, the first photoresist pattern 18 is removed, and a second photoresist pattern 20 is formed on the first inorganic mask layer 16. The first photoresist pattern 18 may be removed by oxygen ashing, for example, $O_2$ plasma ashing. Here, the inorganic mask layer 16 on the organic mask layer 14 prevents ashing of the organic mask layer 14.

The second photoresist pattern 20 includes a second opening that exposes the inorganic mask layer 16 of the second region. As illustrated, the second opening partially overlaps the first recess region 16a, and the overlapping region between the first recess region 16a and the second opening corresponds to the predefined third region.

Figure 4A:
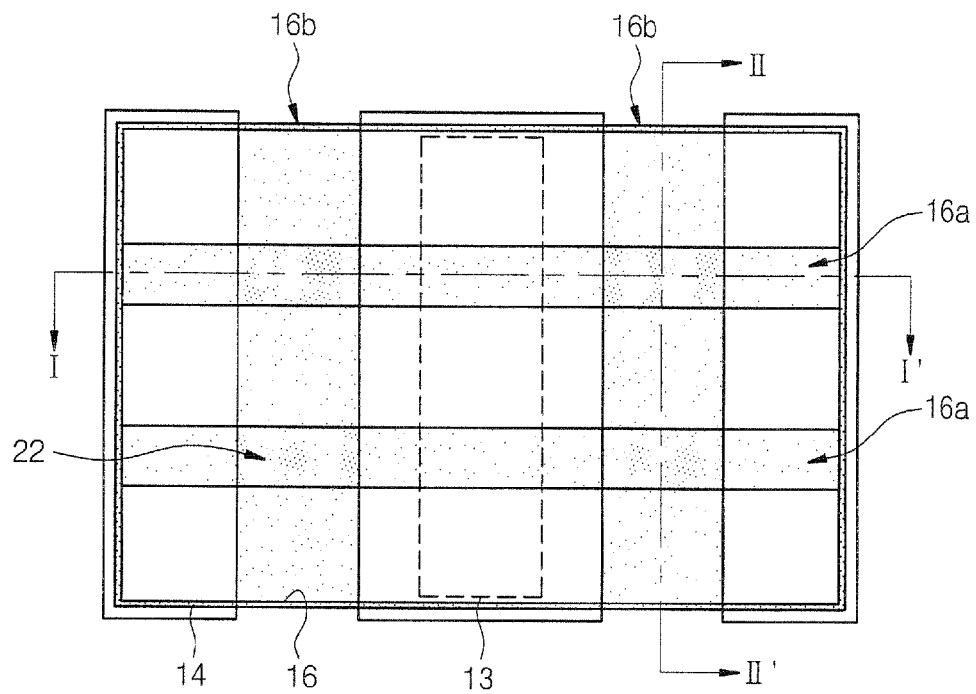
Figure 4B:
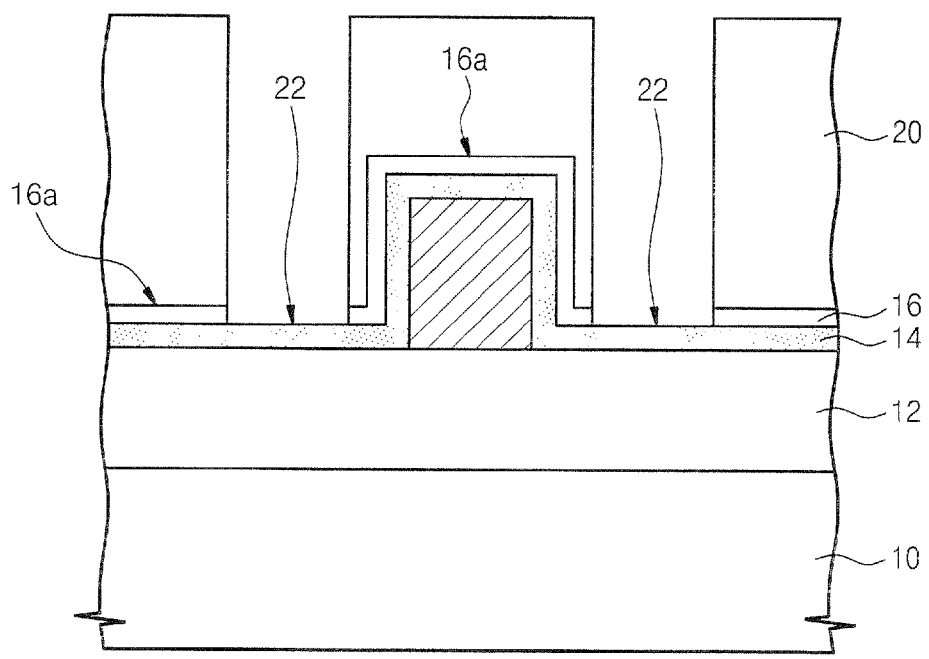
Figure 4C:
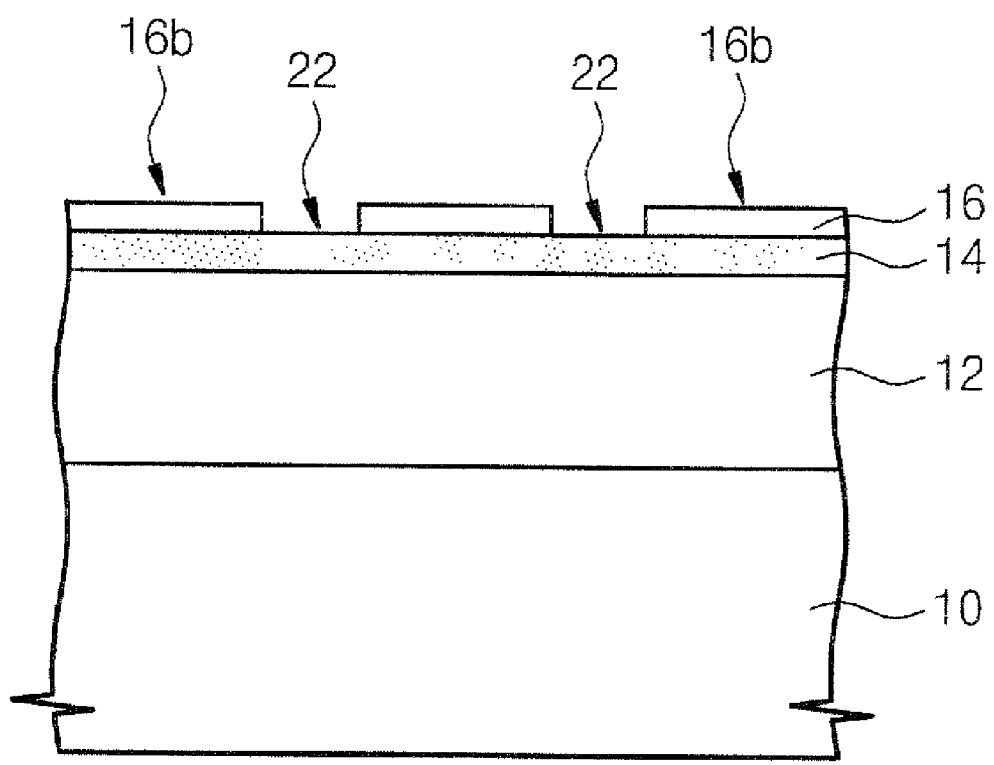

Referring to FIGS. 4A, 4B and 4C, the inorganic mask layer 16 is etched using the second photoresist pattern 20 as an etching mask to simultaneously form a second recess region 16b and a third opening 22 that exposes the organic mask layer 14 of the third region.

The second opening of the second photoresist pattern 20 may have a trench shape extending in a different (perpendicular) direction from the first opening. The second recess region 16b may be a trench shape transferred from the second opening.

As illustrated, the first recess region 16a and the second recess region 16b may be configured to intersect each other. The third opening 22 may include two sidewalls corresponding to sidewalls of the first recess region 16a, and two sidewalls corresponding to sidewalls of the second recess region 16b. In other words, the third opening 22 may have a quadrangular shape.

For comparison, if such a fine opening with a quadrangular shape is formed using a photolithography process, corners of the opening may be distorted due to optical characteristics, resulting in a circular or oval opening. Thus, at such a fine level, optical effects establish natural limits to the detail that one may achieve by the conventional photolithography process. In the example, circular or oval openings may be formed, which deviates from the design, since the openings should be quadrangular with square corners.

In the embodiment of the present invention, however, the photolithography is performed two times to form the fine quadrangular opening, so that the distortion (such as the rounding) of corners of the opening is minimized, and the opening can be formed to closely follow the intended design.

Figure 5A:
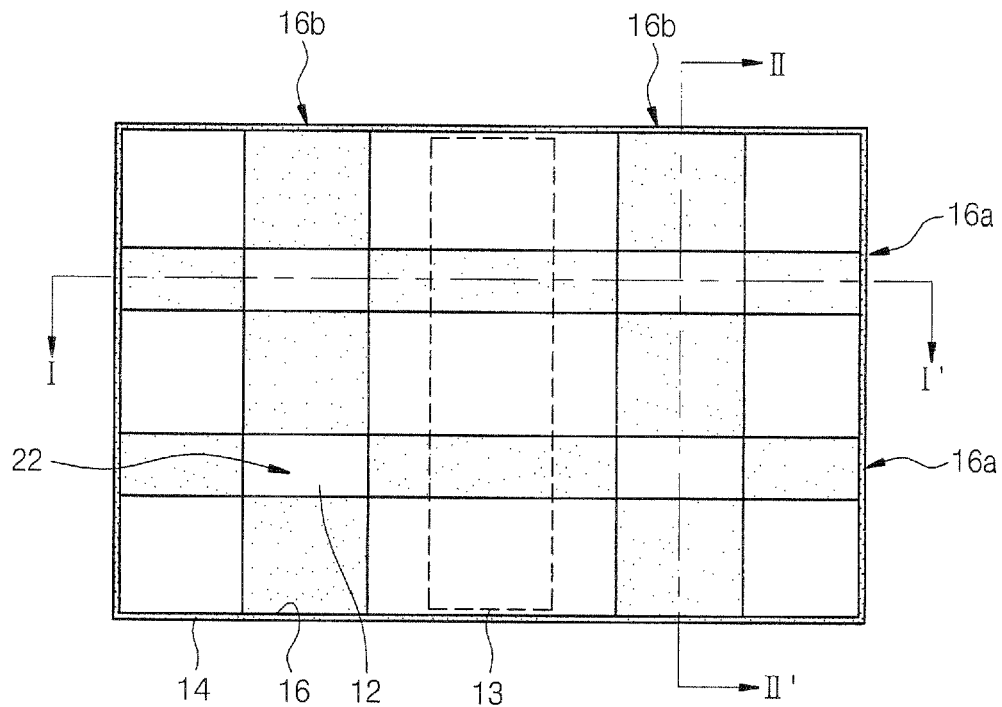
Figure 5B:
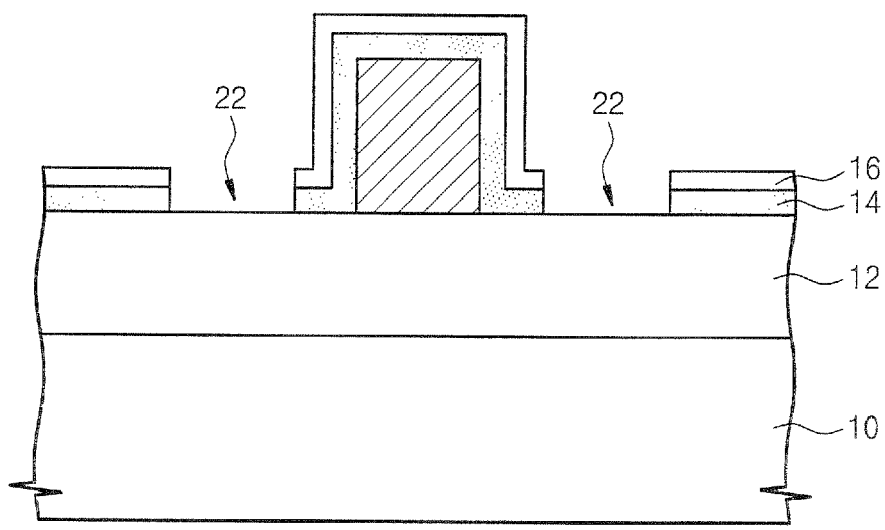
Figure 5C:
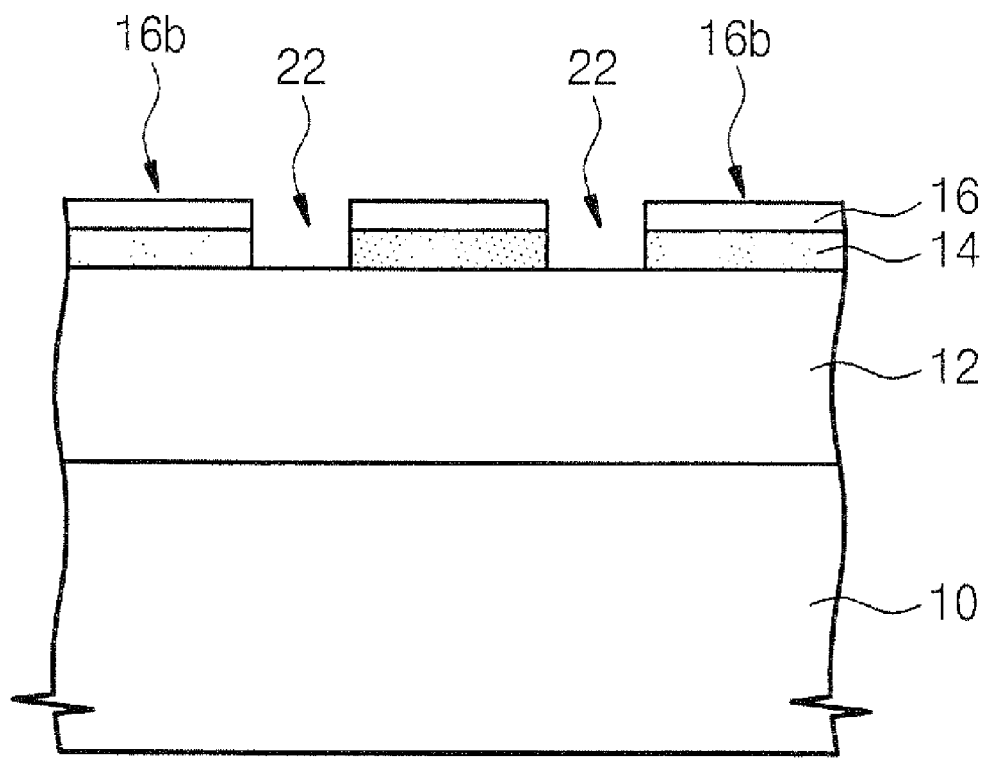

Referring to FIGS. 5A, 5B and 5C, the second photoresist pattern 20 is removed. The second photoresist pattern 20 may be removed by oxygen ashing, such as $O_2$ plasma ashing. The organic mask layer 14 exposed by the third opening 22 is also removable by the oxygen ashing. Accordingly, while the second photoresist pattern 20 is removed, the organic mask layer 14 exposed by the third opening 22 may be removed as well. This exposes the lower layer 12 in the third opening 22.

Figure 6A:
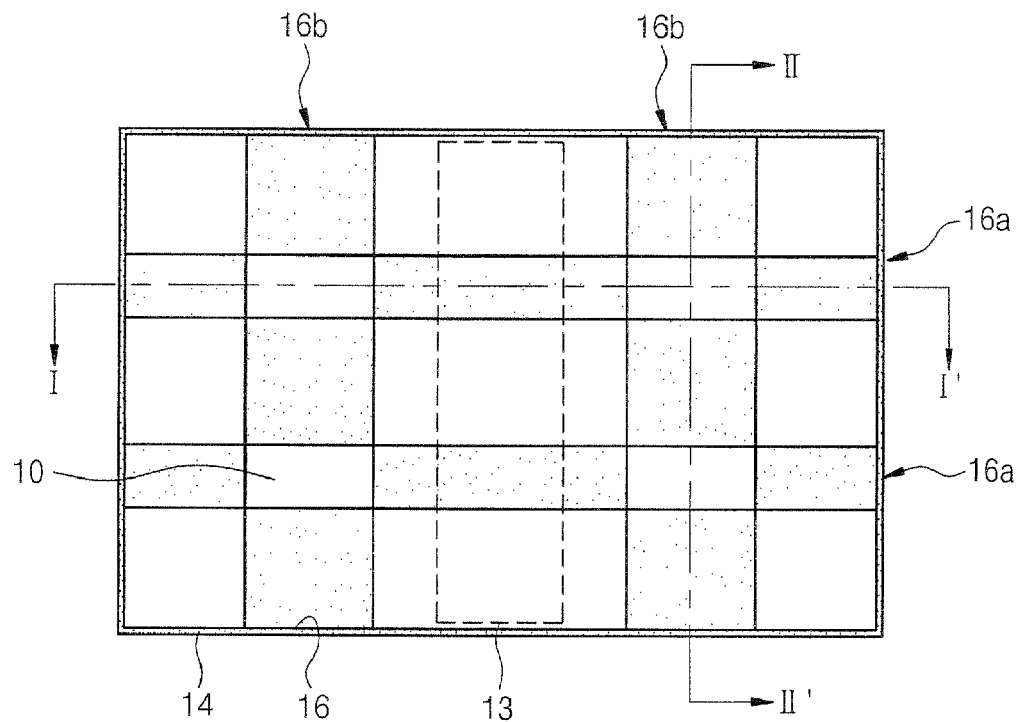
Figure 6B:
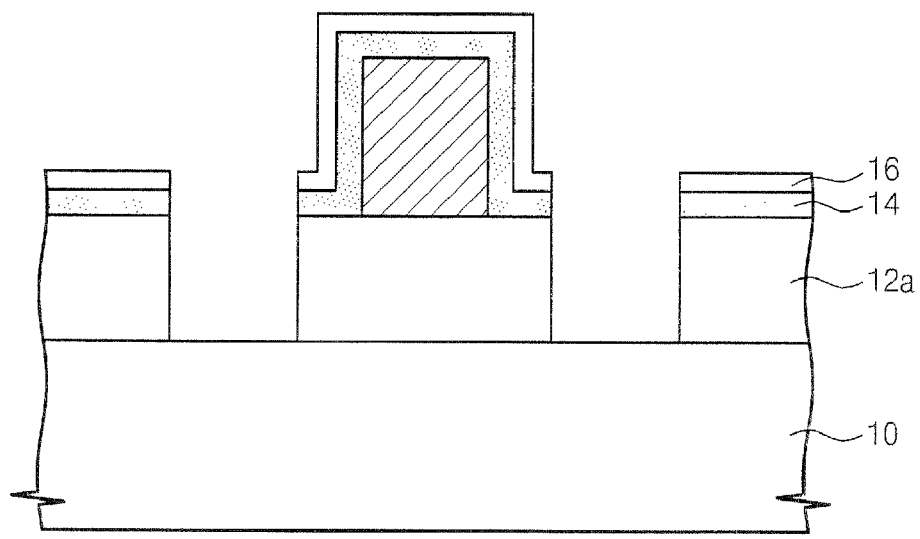
Figure 6C:
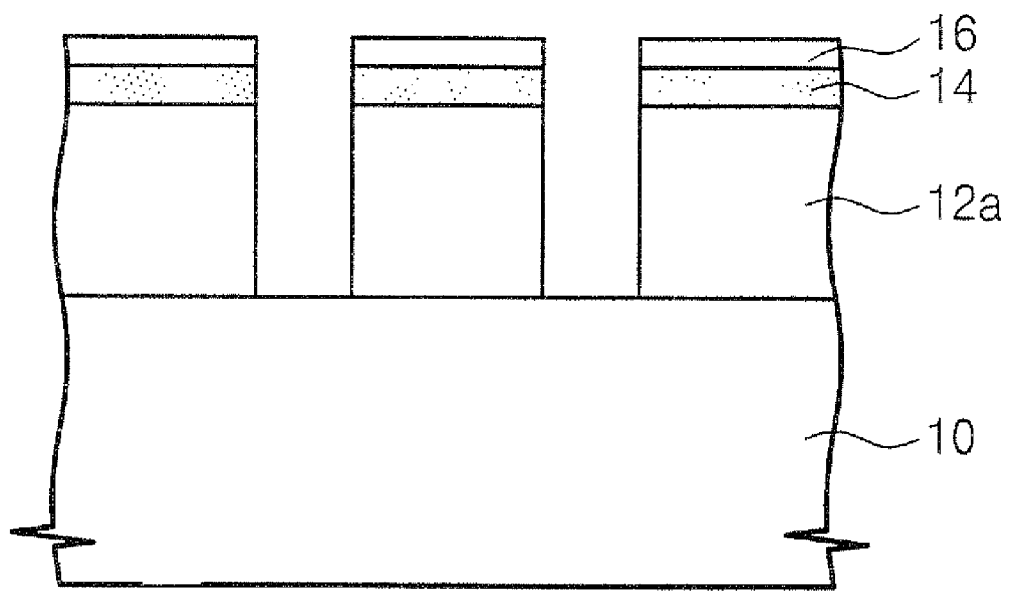

Referring to FIGS. 6A, 6B and 6C, the organic mask layer 14 and the inorganic mask layer 16 having the first recess region 16a and the second recess region 16b are formed on the lower layer 12, and the organic mask layer 14 and the inorganic mask layer 16 have the third opening 22 that exposes the lower layer 12. Accordingly, the lower layer 12 is etched using the inorganic mask layer 16 and the organic mask layer 14 together as an etching mask, to form a hard mask pattern or a structure 12a of a semiconductor device.

Some problems may occur in the present embodiment if the inorganic mask layer 16 is not formed of a material that can provide excellent step coverage. If the inorganic mask layer 16 is not a completely conformal layer, it may be deposited thicker on, say, a corner of the lower structure 13 than on a sidewall thereof.

Figure 7A:
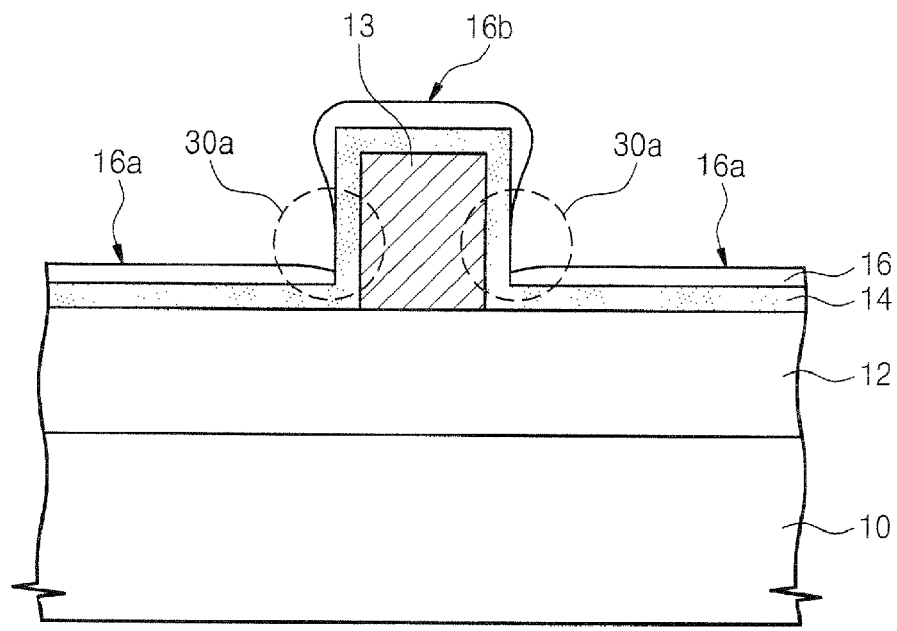
FIGS. 7A and 7B are cross-sectional views illustrating a problem that may occur in the present embodiment.

Referring to FIG. 7A, when the inorganic mask layer 16 is removed to a predetermined thickness to form the first recess region 16a, it may be formed thin enough on a sidewall of the structure 13 to where it may be mostly or completely removed. If the inorganic mask layer 16 is completely removed, then the organic mask layer 14 of the sidewall of the structure 13 may be exposed. This situation is represented by reference number 30a in FIG. 7A.

Figure 7B:
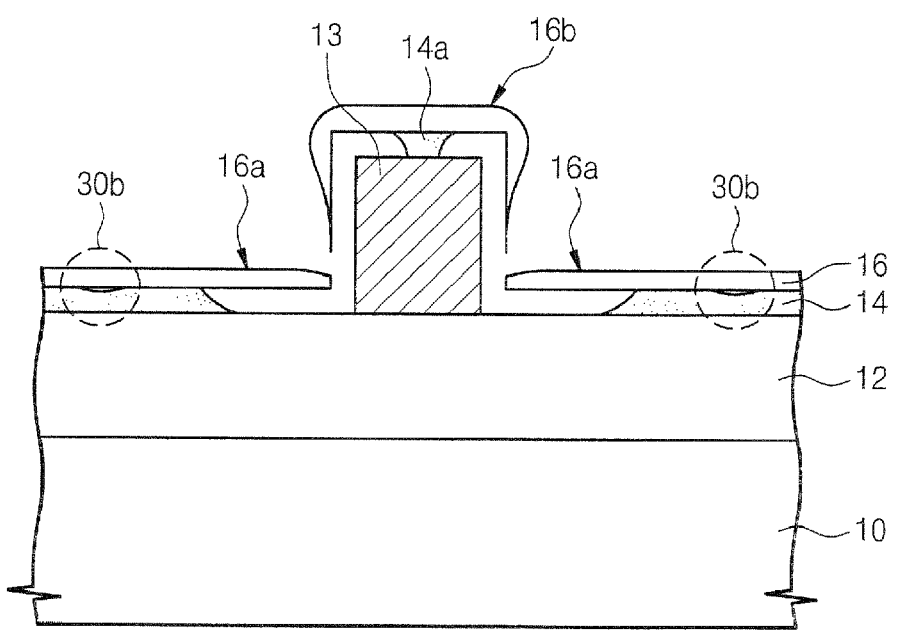

Referring to FIG. 7B, while the first photoresist pattern 18 is removed, the organic mask layer 14 exposed on the sidewall of the structure 13 may be ashed and removed together with the first photoresist pattern 18. As illustrated, when the organic mask layer 14 formed under the inorganic mask layer 16 is removed the inorganic mask layer 16 may be lifted. Also, if the remaining inorganic mask layer 16 is thin enough, $O_2$ plasmas may pass through it and reach the organic mask layer 14, forming a void 30b under the inorganic mask layer 16.

The undesired ashing of the organic mask layer 14 may deteriorate adhesiveness of the inorganic mask layer 16, thereby causing a serious problem of separation of the inorganic mask layer 16 that is to be used as an etching mask.

Figure 8:
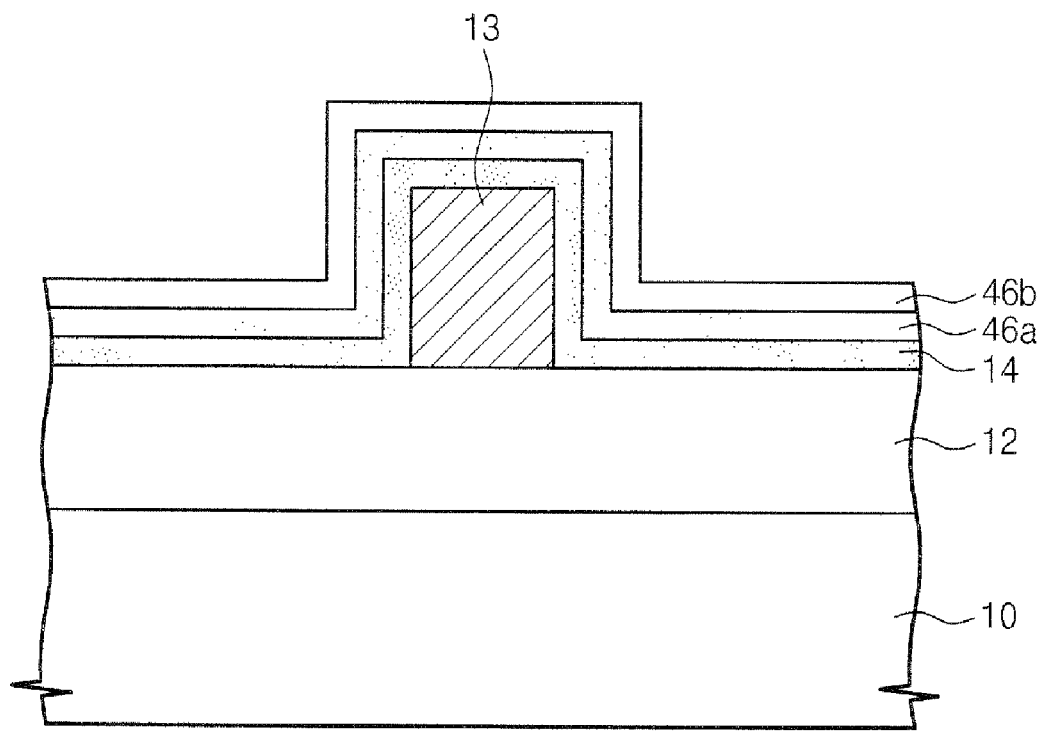
FIG. 8 is a cross-sectional view for describing a second embodiment.

FIG. 8 is a cross-sectional view for describing a method of forming a mask according to a second embodiment. Aspects of the method of this embodiment overcome the problem just described.

Since the ashing problem of the organic mask layer 14 is caused by the relatively thin inorganic mask layer 16 on the sidewall of the structure 13, the problem may be solved by assuring that the inorganic mask layer 16 covering the organic mask layer remain on the sidewall of the lower structure 13.

In the second embodiment, the inorganic mask layer 16 may be formed in a stack structure that includes a first inorganic mask layer 46a and a second inorganic mask layer 46b. The first inorganic mask layer 46a and the second inorganic mask layer 46b are formed of materials having etch selectivity with respect to each other. For example, the second inorganic mask layer 46b may be formed of silicon oxide, and the first inorganic mask layer 46a may be formed of silicon nitride, or silicon oxy nitride such as PE-SiN or PE-SiON.

In this case, the second inorganic mask layer 46b may be removed in the first region to a predetermined thickness to form the first recess region 16a, and a portion of the second inorganic mask layer 46b may be removed in the second region, and the remaining second inorganic mask layer 46b and the first inorganic mask layer 46a are removed in the third region to form the second recess region 16b and the third opening 22.

When the first photoresist pattern 18 is ashed and removed after the first recess region 16a is formed, the organic mask layer 14 is prevented from also being ashed since at least the first inorganic mask layer 46a covers the organic mask layer 14 on a sidewall of the lower structure 13.

Also, since the first inorganic mask layer 46a exposed on the sidewall of the structure 13 is covered with the second photoresist pattern 20, the first inorganic mask layer 46a is not etched while the third opening 22 is formed.

In a modified example of the second embodiment, during the formation of the first recess region 16a, the second inorganic mask layer 46b may be removed until the first inorganic mask layer 46a is exposed, using the first inorganic mask layer 46a as an etch stop layer.

FIGS. 9A through 13A are plan views for describing a third embodiment. FIGS. 9B through 13B are cross-sectional views taken along lines I-I' of FIGS. 9A through 13A, respectively, and FIGS. 9C through 13C are cross-sectional views taken along lines II-II' of FIGS. 9A through 13A, respectively.

Figure 9A:
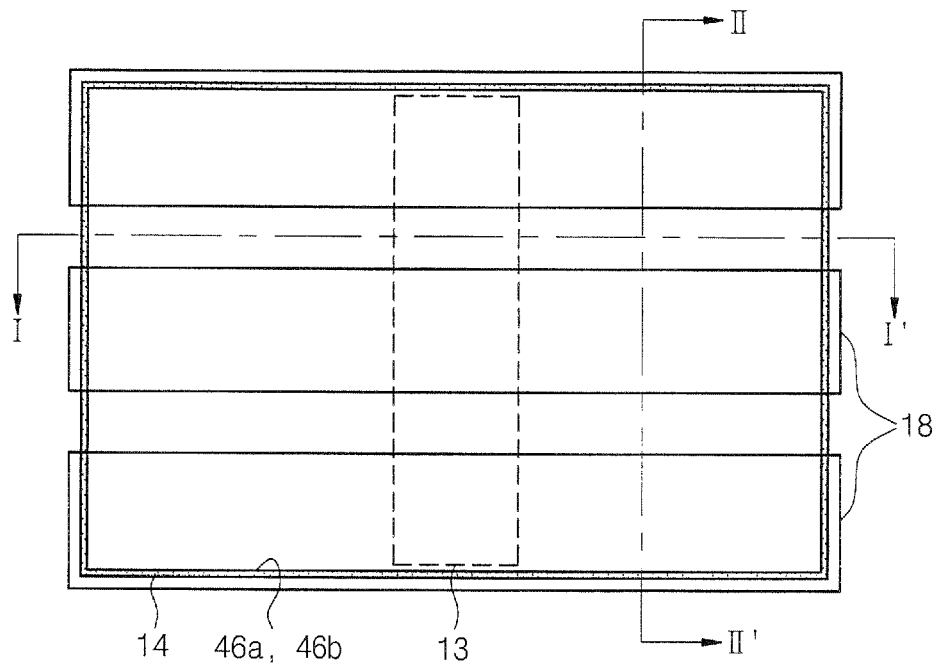
Figure 9B:
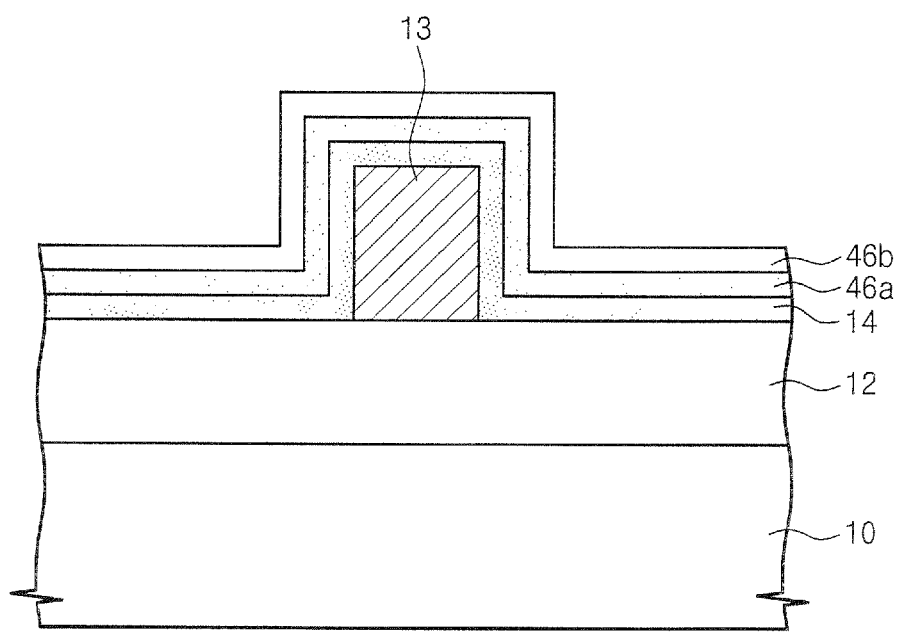
Figure 9C:
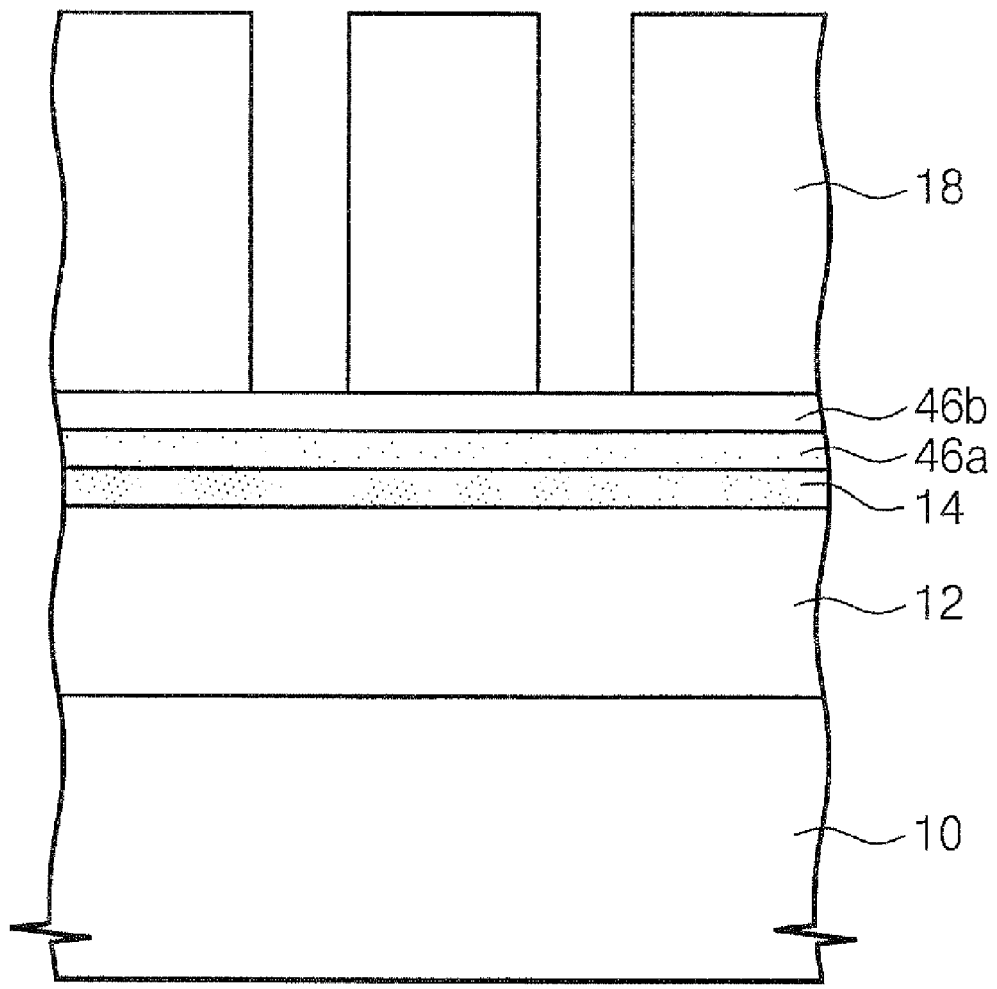

Referring to FIGS. 9A, 9B and 9C, a lower layer 12 is formed on a semiconductor substrate 10, and an organic mask layer 14 and first and second inorganic mask layers 46a and 46b are formed on the lower layer 12.

As in the first embodiment, the lower layer 12 may be a hard mask layer for patterning a material of a semiconductor substrate 10, or may be a material layer etched to form a semiconductor pattern.

A predetermined structure 13 may be formed on the lower layer 12, and the organic mask layer 14, and the first and second inorganic mask layer 46a and 46b may be formed conformally thereon. The structure 13 may be formed on the lower layer 12 as illustrated, but the structure 13 may be formed under the lower layer 12, and the organic mask layer 14 and inorganic mask layers 46a and 46b may be formed conformally on the lower layer 12.

The organic mask layer 14 may be formed of an insulating material including carbon, such as an amorphous carbon layer (ACL).

The organic mask layer 14 and the first and second inorganic mask layers 46a and 46b may be formed conformally on the structure 13. The first inorganic mask layer 46a and the second inorganic mask layer 46b may be formed of materials having etch selectivity with respect to each other. For example, the first inorganic mask layer 46a may be formed of silicon nitride or silicon oxy nitride. The silicon nitride or the silicon oxy nitride may be PE-SiN or PESiON. The second inorganic mask layer 46b may be formed of either undoped silicon glass (USG) or a material by atomic layer deposition (ALD) or radical chemical vapor deposition (RACVD), which can provide excellent step coverage, without using a plasma method.

The first inorganic mask layer 46a may serve as a buffer layer that can compensate for any weak adhesiveness between the ACL and the silicon oxide layer. In this regard, silicon nitride and silicon oxy nitride are suitable for the first inorganic mask layer 14a because of their good adhesiveness with the ACL.

In the present embodiment, although not shown, a first region and a second region may be defined in the semiconductor device 10 as in the first embodiment. The first and second regions may be configured to have an overlapping region therebetween, and the overlapping region between the first region and the second region may be defined as a third region.

The first photoresist pattern 18 includes an opening exposing the second inorganic mask layer 46b of the first region. As illustrated, the first photoresist pattern 18 includes a first opening with a trench shape extending in one direction, as in the first-described embodiment.

Figure 10A:
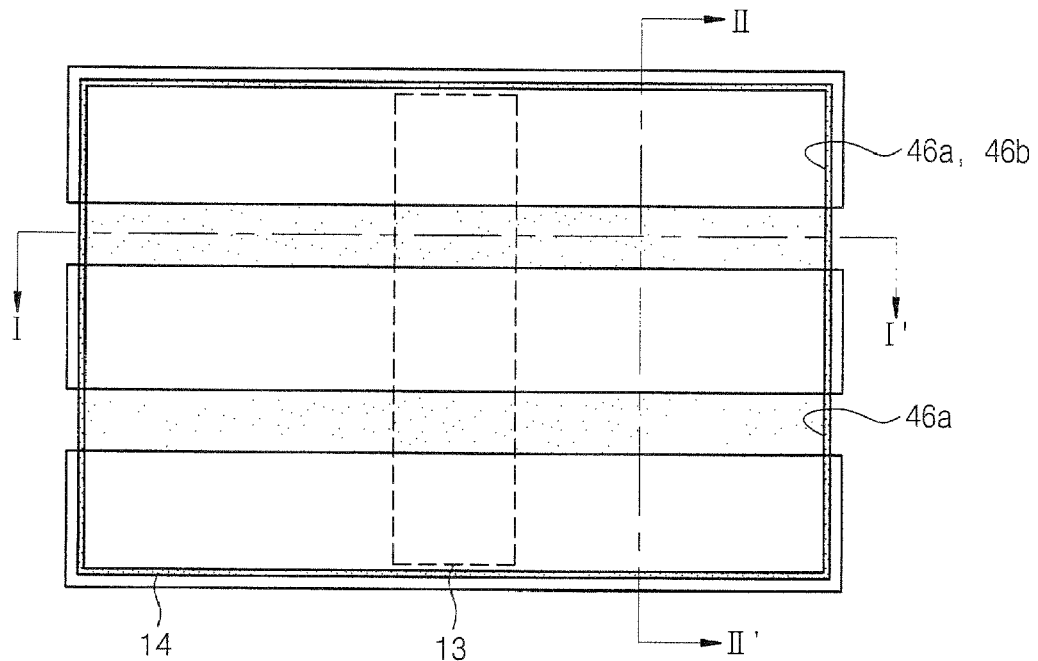
Figure 10B:
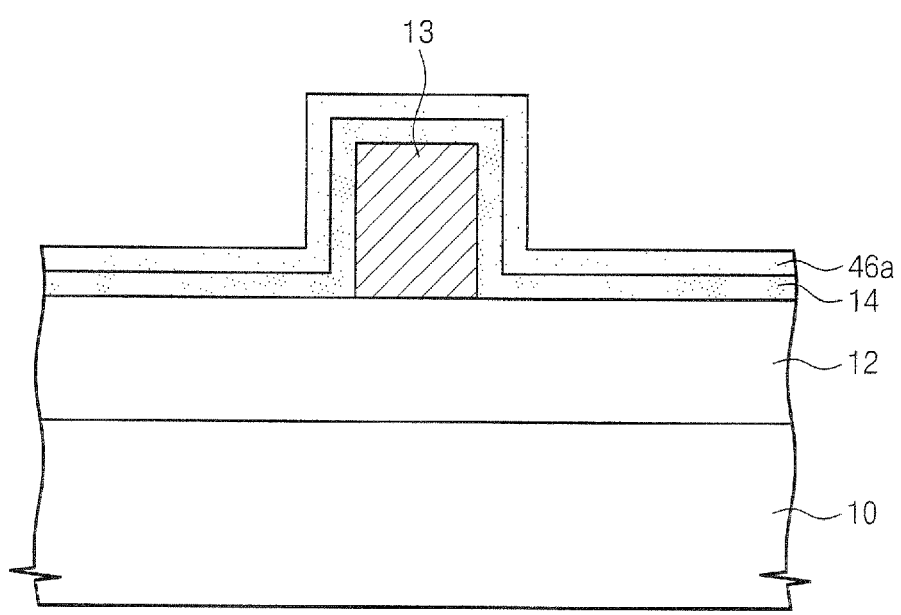
Figure 10C:
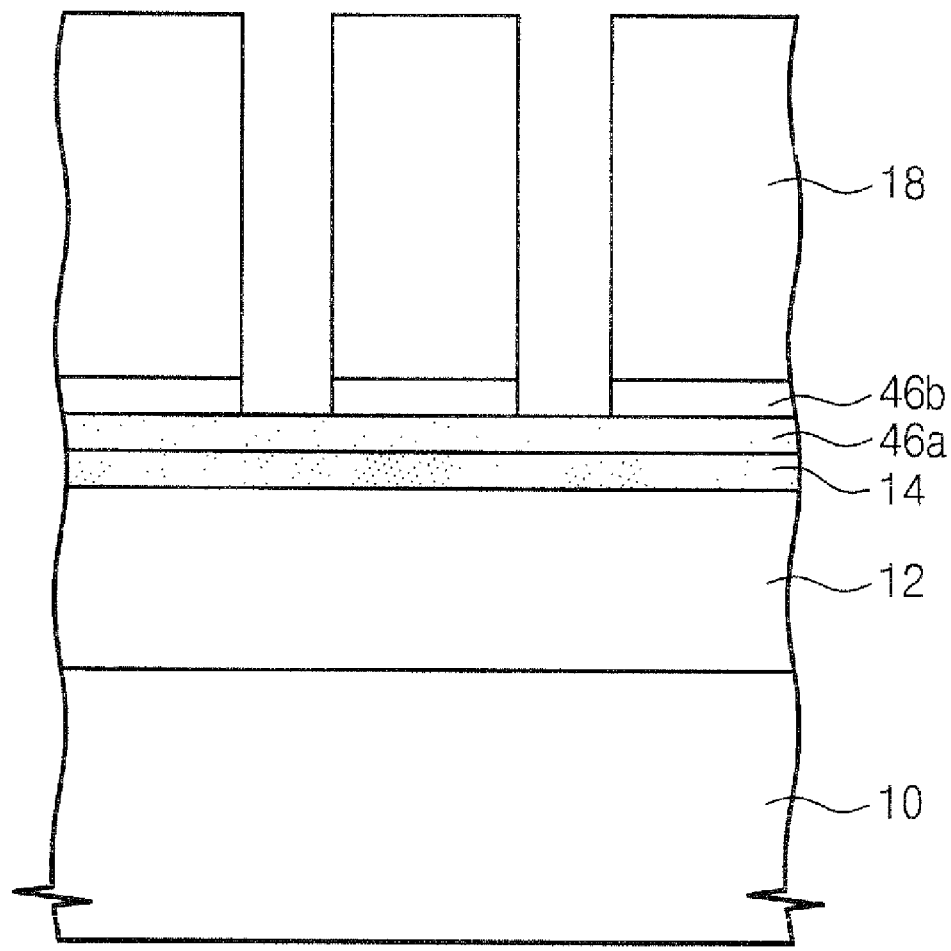

Referring now to FIGS. 10A, 10B and 10C, the second inorganic mask layer 46b of the first region may be etched using the first photoresist pattern 18 as an etching mask, thereby forming a first recess region in which the first inorganic mask layer 46a is exposed.

Figure 11A:
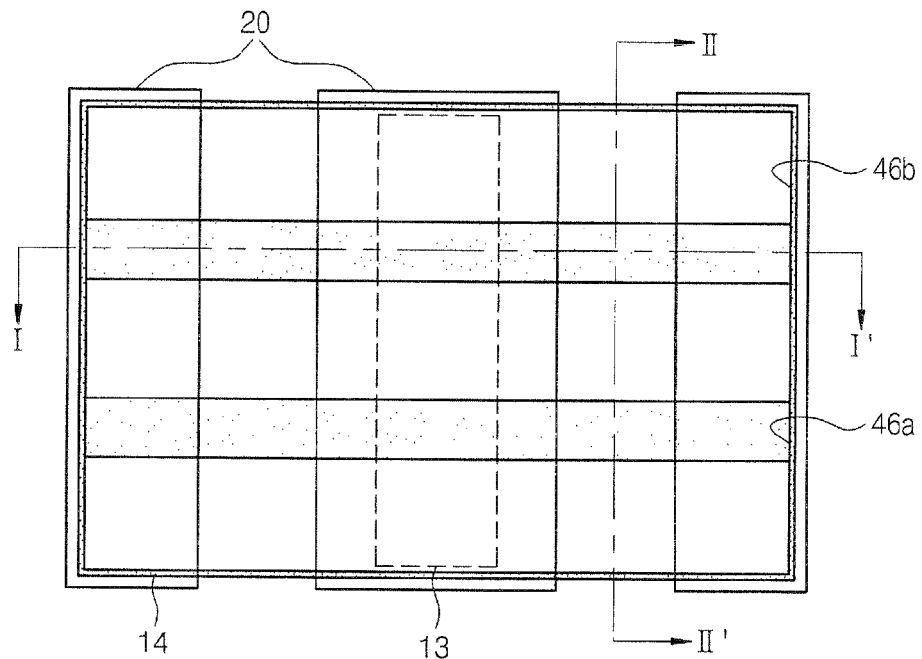
Figure 11B:
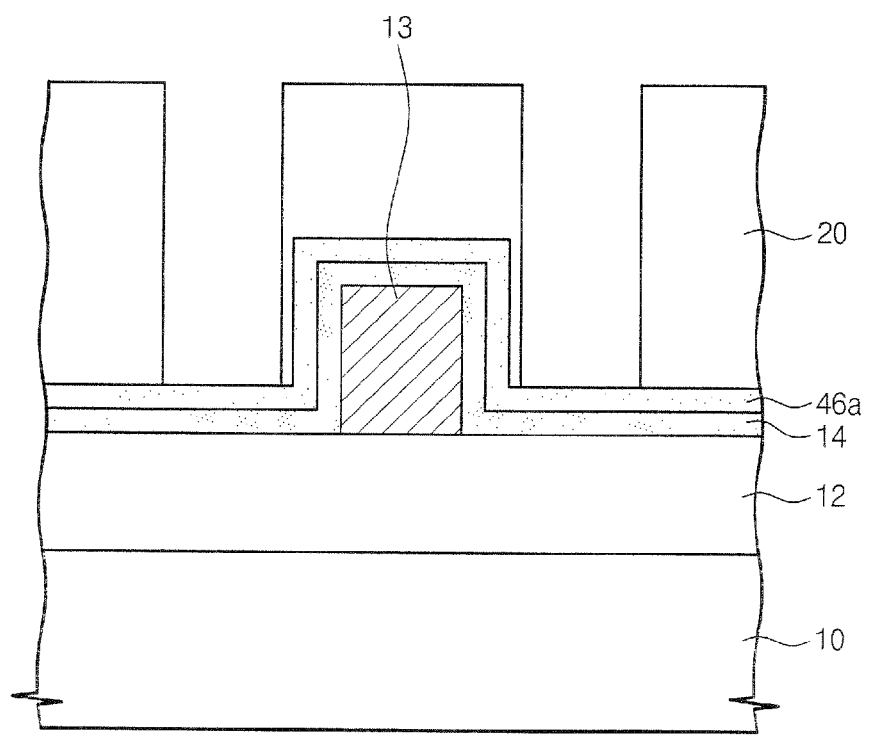
Figure 11C:
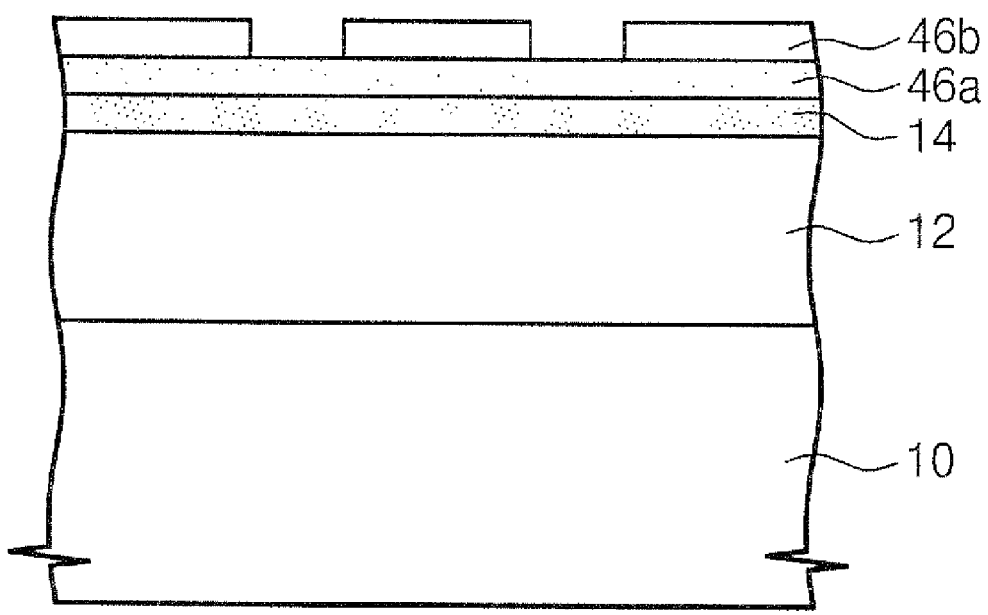

Referring to FIGS. 11A, 11B and 11C, the first photoresist pattern 18 is removed, and a second photoresist pattern 20 may be formed on the second inorganic mask layer 46b. The first photoresist pattern 18 may be removed by oxygen ashing, such as O$_2$ plasma ashing. Here, the first inorganic mask layer 46a on the organic mask layer 14 prevents the organic mask layer 14 from being ashed.

Since the first inorganic mask layer 46a covers the organic mask layer 14 at a sidewall of the structure 13, the organic mask layer 14 is not removed together with the first photoresist pattern 18, as in the previously-described embodiment.

The second photoresist pattern 20 includes a second opening that exposes the inorganic mask layer 46a of the second region. As illustrated, the second opening partially overlaps the first recess region, and the overlapping region between the first recess region and the second opening corresponds to the predefined third region.

Figure 12A:
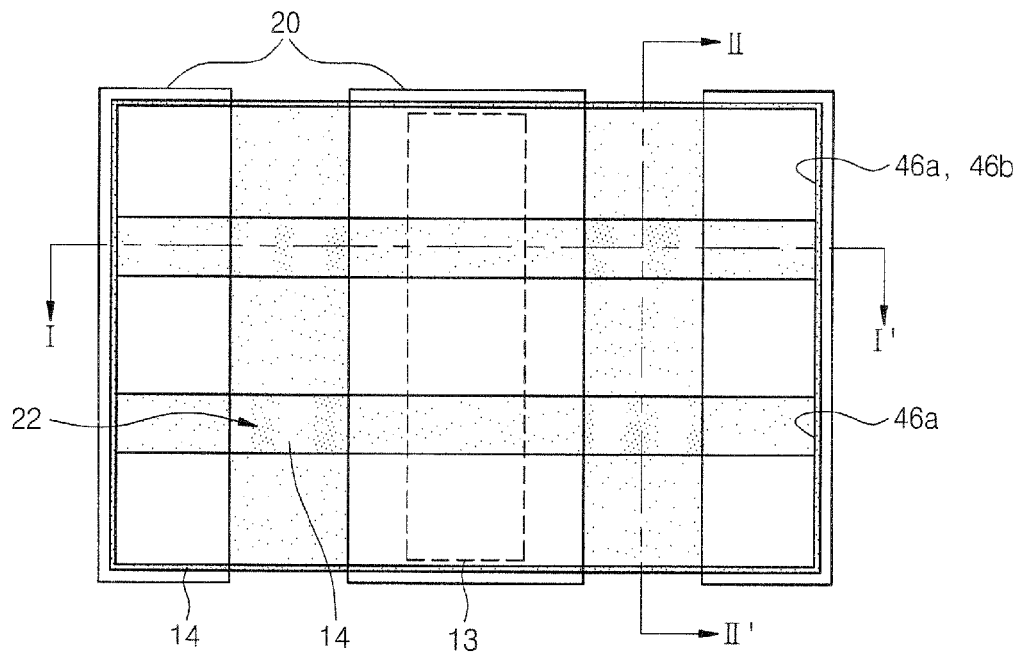
Figure 12B:
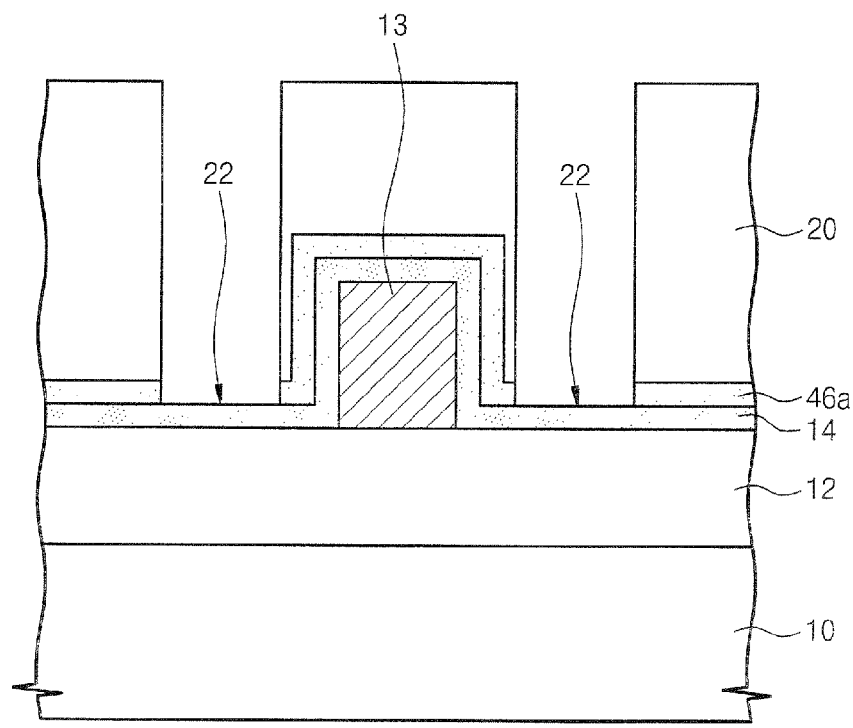
Figure 12C:
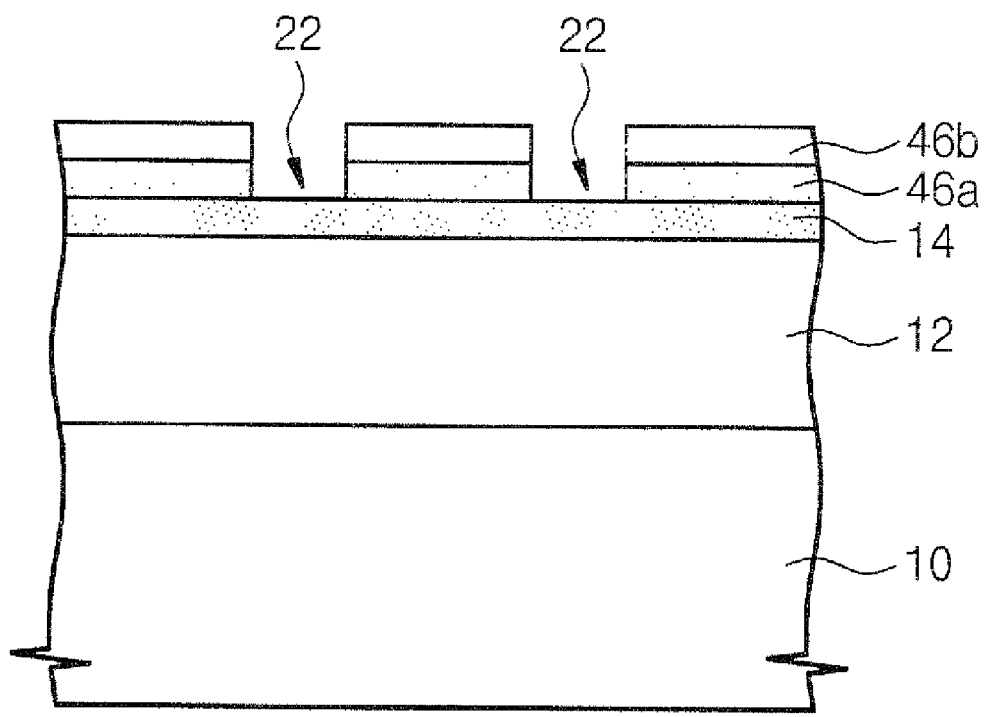

Referring to FIGS. 12A, 12B and 12C, the first inorganic mask layer 46a is etched using the second photoresist pattern 20 as an etching mask, thereby simultaneously forming a second recess region and a third opening 22 exposing the organic mask layer 14 of the third region.

The second opening of the second photoresist pattern 20 may have a trench shape extending in a different direction (such as perpendicular) from that of the first opening. The second recess region may have a trench shape transferred from the second opening.

As illustrated, the first recess region and the second recess region may be configured to intersect each other. The third opening 22 has two sidewalls corresponding to sidewalls of the first recess region, and two sidewalls corresponding to sidewalls of the second recess region. That is, the third opening 22 may have a quadrangular shape. A fine opening with a quadrangular shape may be formed accurately using the photolithography process of the present embodiment, so that each corner of the opening is not distorted due to optical characteristics. The advantages of the embodiments of the present invention have been discussed in this regard earlier.

Figure 13A:
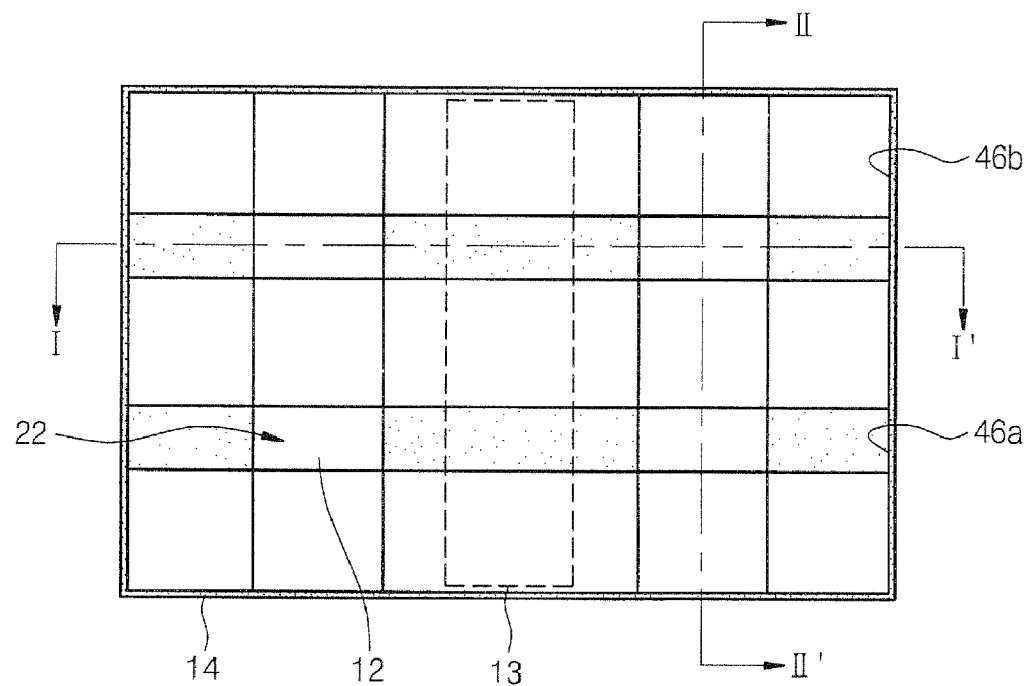
Figure 13B:
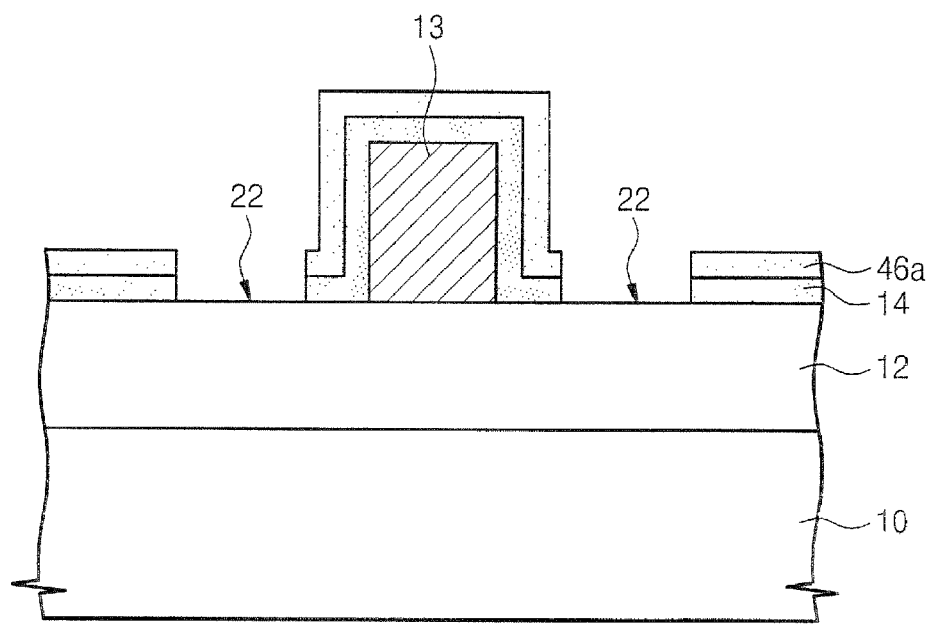
Figure 13C:
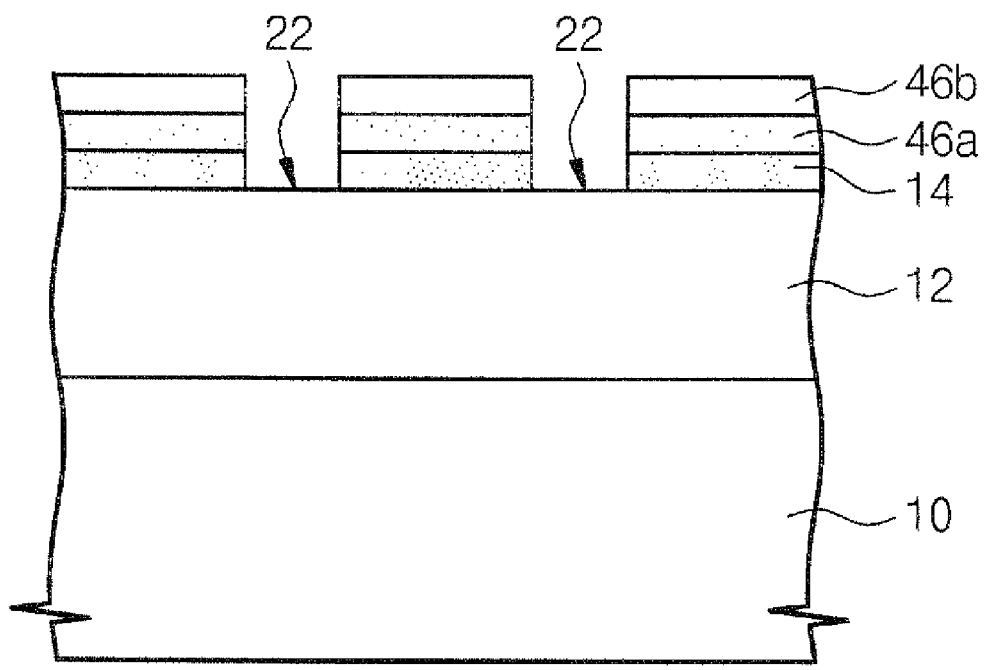

Referring to FIGS. 13A, 13B and 13C, the second photoresist pattern 20 may be removed by oxygen ashing, for example, O$_2$ plasma ashing. The organic mask layer 14 exposed from the third opening 22 is also removable by the oxygen ashing, and so it may be removed while the second photoresist pattern 20 is removed. Thus the lower layer 12 may be exposed in the third opening 22.

As the embodiments have been described so far, a double exposure may be performed using an organic mask layer and an inorganic mask layer, thereby forming a fine feature size that closely follows the intended layout.

Also, the inorganic mask layer may have a multilayered structure to prevent the organic mask layer from being damaged by ashing, and to improve adhesiveness between the organic mask layer and the inorganic mask layer.

Further, the photoresist and the organic mask layer may be simultaneously removed to simplify a process of forming a mask pattern.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of forming a mask pattern comprising:
   preparing a semiconductor substrate in which a first region and a second region partially overlapping each other in a third region are defined;
   depositing an organic mask layer and an inorganic mask layer on the semiconductor substrate;
   forming a first photoresist layer on the inorganic mask layer, the first photoresist layer exposing the first region;
   etching the inorganic mask layer in the first region using the first photoresist layer as an etch mask;
   removing the first photoresist layer;
   forming a second photoresist layer on the inorganic mask layer, the second photoresist layer exposing the second region;
   etching the inorganic mask layer in the second region using the second photoresist layer as an etch mask to expose the organic mask layer in the third region;
   removing the second photoresist layer; and
   removing the organic mask layer exposed in the third region.

2. The method of claim 1, wherein the first photoresist layer is removed using oxygen ashing.

3. The method of claim 1, wherein the organic mask layer includes an amorphous carbon layer.

4. The method of claim 1, wherein the inorganic mask layer is a silicon oxide layer.

5. The method of claim 1, wherein the inorganic mask layer includes a first inorganic mask layer and a second inorganic mask layer that are stacked, the first inorganic mask layer is a silicon nitride layer or a silicon oxy nitride layer, and the second inorganic mask layer is a silicon oxide layer.

6. The method of claim 1, further comprising:
   forming an inorganic hard mask layer before the organic mask layer is formed; and
   etching the inorganic hard mask layer exposed in the third region to form a hard mask pattern.

7. The method of claim 1, wherein the organic mask layer of the third region is removed using oxygen ashing.

8. The method of claim 7, wherein the organic mask layer of the third region is removed using the inorganic mask layer as an anti-ashing layer.

9. The method of claim 1, wherein removing the organic mask layer is performed simultaneously with removing the second photoresist layer.

10. The method of claim 9, wherein the organic mask layer and the second photoresist layer are removed using oxygen ashing.

11. The method of claim 1, wherein the inorganic mask layer includes a first inorganic mask layer and a second inorganic mask layer that are sequentially stacked, and the first inorganic mask layer has a lower etch rate for a specific etching gas than that of the second inorganic mask layer.

12. The method of claim 11, wherein the first inorganic mask layer is a barrier layer for an oxygen plasma.

13. The method of claim 11, wherein etching the inorganic mask layer in the first region comprises exposing the first inorganic mask layer in the first region.

14. The method of claim 11, wherein while etching the inorganic mask layer in the first region, the second inorganic mask layer remains with a third predetermined thickness in the first region.

15. The method of claim 14, wherein etching the inorganic mask layer in the second region comprises:
   exposing the first inorganic mask layer in the third region, and leaving the second inorganic mask layer in the second region excluding the third region; and
   removing the first inorganic mask layer of the third region to expose the organic mask layer.

16. The method of claim 15, wherein exposing the organic mask layer comprises simultaneously etching the first inorganic mask layer of the third region, and the second inorganic mask layer of the second region excluding the third region, so that at least the first inorganic mask layer remains in the second region excluding the third region.

* * * * *